United States Patent [19]

Bayes et al.

[11] Patent Number: 6,054,061
[45] Date of Patent: Apr. 25, 2000

[54] COMPOSITION FOR CIRCUIT BOARD MANUFACTURE

[75] Inventors: Martin Bayes, Hopkinton; Peter W. Hinkley, Whitman, both of Mass.

[73] Assignee: Shipley Company, L.L.C., Marlborough, Mass.

[21] Appl. No.: 08/988,731

[22] Filed: Dec. 11, 1997

[51] Int. Cl.[7] ........................................................ B05D 5/12
[52] U.S. Cl. ................... 216/13; 216/2; 216/106; 216/108; 252/79.2; 252/79.3; 134/2; 134/3
[58] Field of Search .................................. 216/2, 13, 106, 216/108; 252/79.2, 79.4; 134/2, 3

[56] References Cited

U.S. PATENT DOCUMENTS

| | | | |
|---|---|---|---|
| 3,756,957 | 9/1973 | Shiga | 252/79.4 |
| 3,773,577 | 11/1973 | Shibasaki et al. | 156/8 |
| 3,948,703 | 4/1976 | Kushibe | 156/20 |
| 5,800,859 | 9/1998 | Price et al. | 427/98 |

FOREIGN PATENT DOCUMENTS

| | | |
|---|---|---|
| 96/19097 | 12/1995 | WIPO . |
| WO 96/19097 | 6/1996 | WIPO . |

OTHER PUBLICATIONS

Derwent Info Ltd., Patent Abstract of Japanese Patent No. 51027819. Sep. 1974.
Derwent Info Ltd., Patent Abstract of Japanese Patent No. 3079778. Aug. 1989.
Derwent Info Ltd., Patent Abstract of Japanese Patent No. 6112646. Sep. 1992.

*Primary Examiner*—John F. Niebling
*Assistant Examiner*—Alexander G. Ghyka
*Attorney, Agent, or Firm*—S. Matthew Cairns; Darryl P. Frickey

[57] ABSTRACT

A process and composition for treating a metal surface to increase its surface roughness for subsequent adhesion to a polymer layer. The composition comprises hydrogen peroxide, inorganic acid, an amine free of a surfactant group and optionally, a corrosion inhibitor. The composition is characterized by elimination of a surfactant from solution.

30 Claims, No Drawings

COMPOSITION FOR CIRCUIT BOARD MANUFACTURE

BACKGROUND OF THE INVENTION

1. Field of the Invention

This invention relates to a process for the manufacture of multilayer printed circuit boards. In particular, this invention relates to a novel composition for treatment of copper and its alloys to form a surface having a uniformly etched and conversion coated surface with desirable properties for lamination of circuit layers in multilayer circuit fabrication.

2. Description of the Prior Art

Multilayer printed circuit boards are used for a variety of electrical applications and provide the advantage of conservation of weight and space. A multilayer board is comprised of two or more circuit layers, each circuit layer separated from another by one or more layers of dielectric material. Circuit layers are formed by applying a copper layer onto a polymeric substrate. Printed circuits are then formed on the copper layers by techniques well known to the art, for example print and etch to define and produce the circuit traces—i.e., discrete circuit lines in a desired circuit pattern. Once the circuit patterns are formed, a stack is formed comprising multiple circuit layers separated from each other by a dielectric layer, typically epoxy. Once the stack is formed, it is subjected to heat and pressure to form the laminated multilayer circuit board.

Following lamination, the multiple circuit layers are electrically connected to each other by drilling through holes through the board surface. Resin smear from through-hole drilling is removed under rather stringent conditions, for example, by treatment with a concentrated sulfuric acid or hot alkaline permanganate solution. Thereafter, the through-holes are further processed and plated to provide a conductive interconnecting surface.

Prior to lamination and through hole formation, the discrete copper circuit lines are typically treated with an adhesion promoter to improve bond strength between each circuit layer and adjacent interleaving dielectric resin layers. One method used by the art to improve bond strength involves oxidative treatment of the copper circuit lines to form a copper oxide surface coating on the circuit lines. The oxide coating is usually a black or brown oxide layer that adheres well to the copper. The oxide possesses significantly more texture or roughness than an untreated copper surface. Chemical treatments which produce adherent conversion coatings on metal surfaces, such as black oxide, are very commonly used as to promote adhesion of organic materials to metals. Other examples include metal phosphate coatings used as paint adhesion promoters. Such roughened and conversion coated surfaces enhance adhesion and wettability to the adjacent insulating layer by a mechanism that is believed to include mechanical interlocking between the metal surface and a dielectric resin layer. Metal surfaces that have been microetched, but not conversion coated do not generally possess as high a degree of surface roughness and texture, as can be inferred from their greater reflection of visible light.

Oxide layers are most often formed using highly alkaline solutions containing an oxidizing agent, typically sodium chlorite as disclosed in U.S. Pat. Nos. 2,932,599 and 4,844,981.

As described above, following formation of a multilayer stack, metallized through holes are formed to provide electrical connections between circuit layers. The formation of the metallized holes involves treatment with acidic materials. The acidic materials have a tendency to dissolve the copper oxide on the circuit lines where exposed in a through hole, interfering with bond between the circuit lines and the dielectric resin material and often causing a condition known in the art as pink ring. To reduce the susceptibility of the oxide to such attack, the oxide treatment described above is often followed by a step of converting the copper oxide to a form less soluble in acid while retaining enhanced surface roughness. Exemplary processes include reduction of the oxide by treatment with a reducing solution such as dimethylamine borane as shown in U.S. Pat. No. 4,462,161, an acid solution of selenium dioxide as shown in U.S. Pat. No. 4,717,439, or a sodium thiosulfate solution as shown in U.S. Pat. No. 5,492,595. An alternative approach involves partial or complete dissolution of the oxide layer to provide a copper surface having enhanced texture as shown in U.S. Pat. No. 5,106,454.

Other techniques known in the art to promote adhesion between copper surfaces and dielectric resins prior to multilayer lamination include the use of etches inclusive of cupric chloride etchants, mechanical treatments designed to produce surface texture, and metal plating, all designed to produce roughened surfaces. Historically, mechanical treatment and chemical etching procedures have not generally found wide acceptance in the industry, most likely due to deficiencies in both process consistency and in the bond strength to the dielectric material. Electrolytic metal plating processes may provide highly roughened surfaces and are commonly used to enhance adhesion of continuous sheets of copper to epoxy for formation of copper circuit board laminates. However, the innerlayers of a printed circuit board contain many electrically discrete circuit traces which prevent use of a process requiring electrical connection to all areas to be plated.

Oxidizing solutions containing peroxide are well known in the art. Such solutions have been used for a variety of purposes including removal of oxide scale, cleaning of surfaces, creation of smoother, brighter metallic surfaces and creation of microroughened metal surfaces. For example, in CA-A-1250406, metals such as iron, copper or their alloys are treated using a solution comprising hydrogen peroxide for metal pickling or polishing. The hydrogen peroxide solution contains a stabilizer, optionally a corrosion inhibitor such as benzotriazole, and an anionic or non-ionic surfactant. Because hydrogen peroxide decomposition is a problem, many hydrogen peroxide based compositions have been developed, each comprising a different type of stabilizing system.

Cleaning or polishing compositions based on hydrogen peroxide are described, for example, in U.S. Pat. No. 3,556,883 which discloses compositions comprising hydrogen peroxide, sulfuric acid and alcohol stabilizers for cleaning of, for example, metal wires. Other similar cleaning compositions are described in U.S. Pat. No. 3,756,957 where a stabilizer for hydrogen peroxide is selected from the group of aliphatic amines and their salts, alkoxy amines, aliphatic acid amines and aliphatic amines.

For use in the printed circuit industry, hydrogen peroxide etching solutions are known and have been described as etchant compositions for use in an etching step for forming a copper circuit pattern from copper laminate mounted on an insulating layer protected in a pattern corresponding to a final desired circuit pattern. The foil is then contacted with the etching solution and the unprotected copper leaving the desired circuit pattern. During the etching processes, the copper foil contacted with the hydrogen peroxide-based composition is etched away for complete removal. Peroxide etchants are described, for example, in U.S. Pat. Nos. 4,144,119; 4,437,931; 3,668,131; 4,849,124; 4,130,454; 4,859,281 and 3,773,577. In the latter two references, the etching composition also comprises a triazole to increase etch rate.

In U.K. Patent No. 2,203,387, a copper etching process is described with an etch bath regeneration step. A hydrogen peroxide etching composition comprising stabilizers including wetting agents is disclosed for cleaning copper surfaces of a printed circuit board prior to electroplating an additional copper layer onto the conducting layer which is formed from copper. After the electroplating step, a photoresist or screen resist is applied.

In U.S. Pat. No. 4,051,057, a bright dip composition for polishing/pickling metal surfaces, for instance of copper, comprises sulfuric acid, a hydroxy acid, such as citric acid, hydrogen peroxide, a triazole and/or a tertiary fatty-amine. The incorporation of surfactant is said to increase the rate of etching and oxide removal from the surface and the incorporation of benzotriazole is said to improve the "leveling effect".

In U.S. Pat. No. 3,948,703, chemical copper polishing compositions are described containing hydrogen peroxide, an acid and an azole compound. The compositions may also contain a surfactant and nonionic surfactants are used in the working examples.

In U.S. Pat. No. 4,956,035, chemical polishing compositions for metal surfaces comprise an etching composition, such as ferric chloride or peroxy sulfuric acid with a quaternary ammonium cationic surfactant and a secondary surfactant.

In U.K. Patent No. 2,106,086, hydrogen peroxide/acid compositions are used to etch, chemically mill or bright dip copper surfaces. The compositions contain triazole compounds to stabilize them against decomposition by heavy metal ions.

In Japanese published application No. 06-112,646, a copper surface is roughened to improve adhesion in laminates for the production of multilayer printed circuit boards. The roughening is carried out a by two-step process, each step involving treatment with a hydrogen peroxide/sulfuric acid composition. Both compositions must be free of a corrosion inhibitor.

In Japanese applications Nos. 03-140481 to 03-140484, copper surfaces are pretreated prior to lamination with a hydrogen peroxide/sulfuric acid composition to form a roughened surface. In 03-140484, the composition contains an additive (CB-596) manufactured by the Xekki Co., which is said to accelerate the process and inhibit decomposition of peroxide.

In U.S. Pat. No. 3,773,577, a copper etchant based on sulfuric acid and hydrogen peroxide contains an aliphatic amine, examples being primary or tertiary amines. The amines are not surface active. In Japanese application 03-79,778 a copper etchant based on sulfuric acid and hydrogen peroxide contains a triazole and chloride ion together with an alcohol or glycol. In Japanese application No. 51-27,819 a copper etchant based on hydrogen peroxide and sulfuric acid contains a tetrazole and optionally a tertiary amine or an alcohol.

In PCT application Publication No. WO 96/19097 published June 20, 1996, it is reported that a hydrogen peroxide containing aqueous composition used on a copper surface forms a cleaned copper surface which is both micro-roughened and conversion coated so as to have sufficiently good porosity that enables a strong bond to form with an organic layer as required in the preparation of multilayer boards. In accordance with the publication, it is disclosed that a process is provided for treating a metal surface comprising contacting the conducting layer of a circuit with an adhesion promotion composition comprising 0.1 to 20% by weight hydrogen peroxide, an inorganic acid, an organic corrosion inhibitor and a surfactant in an adhesion promotion step to form a micro-roughened conversion-coated surface. It is stated that the process is particularly useful for forming multilayer printed circuit boards comprising an innerlayer and an outerlayer, the innerlayer comprising at least one insulating layer and at least one conducting layer and the outerlayer comprising at least an insulating layer, in which the conducting layer is the metal surface treated with the peroxide composition. After the adhesion promotion, a polymeric material is adhered directly to the conducting layer of the innerlayer. The polymeric material may be the insulating layer of the outerlayer or for direct adhesion to the insulating layer of the outerlayer. It is further stated that the process may be used to provide a roughened surface to which polymeric materials such as photoimageable resins, solder masks, adhesives or polymeric etch resists have improved adhesion, usually in the manufacture of printed circuit boards. Finally, it is stated that the process is advantageous as it overcomes the need for forming a black or brown copper oxide layer, as in prior art processes.

Each aforesaid publication is incorporated herein by reference.

Though the process of the World Application identified above achieves many of the objectives stated, the presence of the surfactant may cause difficulties. Formulations containing surfactants are often difficult to use in the spray mode because of excessive foaming of the solution. Rinsing of the surfactant from the coating is often difficult because a surfactant often bonds to a surface. If surfactant is left on the surface, it may interfere with bond strength between the oxide coating and the surface adhered to the coating.

SUMMARY OF THE INVENTION

In accordance with the present invention, there is provided a process for treating a metal surface in an adhesion promotion step to form a roughened conversion coated surface comprising contact of the conducting layer of the surface with an adhesion promotion composition comprising 0.1 to 20% by weight hydrogen peroxide, one or more inorganic acids, an amine or quaternary ammonium compound, each free of a surfactant substituent and a corrosion inhibitor.

The treatment composition of the invention is similar to the composition of PCT Application No. WO 96/19097 referenced above, but is an improvement by replacement of the surfactant of the application with the non-surfactant amine or quaternary ammonium compound. It is an unexpected and surprising result that equivalent conversion coatings may be obtained by substitution of the amine or quaternary ammonium compound for the surfactant.

DESCRIPTION OF THE PREFERRED EMBODIMENTS

The adhesion promotion composition of the invention is an aqueous composition which comprises hydrogen peroxide, one or more inorganic acids, an amine or quaternary ammonium compound, each free of a surfactant functionality, and one or more organic corrosion inhibitors. The use of the composition results in the formation of a roughened conversion coated surface believed to be composed of an insoluble complex of copper. The roughened surface provides substantial surface area that promotes good adhesion to applied organic coatings.

Hydrogen peroxide is present in the adhesion promotion composition in a concentration of at least 0.01% by weight active hydrogen peroxide up to a maximum of 20% by weight. Preferably, the concentration of hydrogen peroxide varies between 0.5% and 10%, and more preferably, between 1% and 5% by weight. If the concentration of hydrogen peroxide in the adhesion promotion composition is too high, the appearance and uniformity of the surface film are degraded.

The inorganic acid in the adhesion promotion composition comprises one or more inorganic acids, preferably a mixture of organic acids, mixtures of phosphoric acid and sulfuric acid in ratios of 1 to 3 to 3 to 1 being particularly preferred. It has been found that the mixture of the acids permits greater latitude in the selection of the amine and results in the formation of coatings that are darker in color, indicating the formation of a thicker coating. The thicker coating provides a more uniform surface treatment which is likely to be more tolerant of subsequent handling. The concentration of acid in the composition should be no greater than 50%, preferably should vary between 1 and 30%, and most preferably, the acid should vary between 5% and 20% by weight of the total composition.

The corrosion inhibitor, when used, is typically selected from one or more of a triazole, tetrazole or imidazole. Unsubstituted and substituted triazoles and benzotriazoles are preferred. Suitable substituents may be, for example, an alkyl group having 1 to 4 carbon atoms.

The corrosion inhibitor is desirably present in the composition in an amount of from about 0 to 1% by weight. Preferably, the concentration of the corrosion inhibitor is at least 0.1% and more preferably, between 0.5% and 0.8% by weight of the total composition.

The composition of the invention includes an amine or quaternary ammonium compound. The term amine as used herein is defined as a lower aliphatic, cycloaliphatic or aromatic amine—i.e., a primary, secondary or tertiary amine having C1 to C8 substitution. The term quaternary ammonium compound as used herein is also defined as a lower aliphatic, cycloaliphatic or aromatic compound. Each term excludes from its scope materials having fatty substitution or other surfactant groups. Each substituents on the amine may be aliphatic, cycloaliphatic or aromatic and each of such substituents may be further substituted with groups such as carboxyl, nitro, sulfonyl, hydroxyl, etc. Exemplary amines include methylamine, dimethylamine, trimethylamine, ethylamine, triethylamine, tripropylamine, isopropylamine, triallylamine, n-butylamine, t-butylamine, n-amylamine, cyclohexylamine, dicyclohexylamine, etc. Exemplary quaternary ammonium compounds include tetramethylammonium hydroxide, tetraethylammonium hydroxide and dimethyl-diethylammonium hydroxide. The amines are used in a concentration in an amount of from 0.01 percent by weight to 2.5 percent and more preferably, in a concentration of from 0.1 to 1.0 percent by weight.

Other optional components may be incorporated in the composition. A preferred additional component comprises a stabilizing agent for hydrogen peroxide. Suitable stabilizing agents may be those mentioned in the patents above. Examples include dipicolinic acid, diglycolic and thiodiglycolic acid, ethylene diamine tetraacetic acid and its derivatives, magnesium salts of an aminopolycarboxylic acid, sodium silicate, phosphonates and sulphonates.

When the composition includes a stabilizing agent, the stabilizing agent is desirably present in an amount of form 0.001% and preferably at least 0.005% by weight of the adhesion promotion composition. More preferably, the concentration of the stabilizing agent varies between 0.5 and 5% by weight of the composition.

The adhesion promotion composition of the invention may be prepared by mixing the components in an aqueous solution, preferably formed using deionized water. In accordance with standard safe practices, hydrogen peroxide is desirably added to the composition in a diluted form. The components forming the adhesion promotion composition are mixed as required.

In use of the formulation, copper, or a copper alloy surface is cleaned by mechanical or chemical cleaning and then contacted with the adhesion promoter. The copper surface may have previously been provided with a tarnish-inhibiting coating e.g. by incorporating the tarnish inhibitor into a resist stripping composition used in an immediately preceding step of etch resist stripping. Tarnish inhibitors used in such strippers are, for example a triazole or other coating. If so, it may be desirable to pre-clean the copper surface with a pre-cleaner before contact with the oxide forming composition. In a preferred embodiment of the invention, the adhesion promotion step follows an etch resist stripping step or there is a single pre-cleaning step between the etch resist stripping step and the adhesion promotion step.

Contact with the adhesion promotion composition may be by any conventional means, for example, by immersion in a bath of the adhesion promotion composition or by spraying or any other means of contact. Contact may be as part of a continuous process. The treatment is at a temperature desirably not exceeding 75° C. and more preferably, at a temperature varying between 20° C. and 50° C. Contact time is at least 1 second and preferably between 5 seconds and 2 minutes though the maximum contact time may be up to 10 minutes. A contact time of about 1 minute or less than 1 minute is particularly preferred.

The process can be used to replace the black copper oxide adhesion promotion step in a considerably reduced number of steps. The micro-roughened and conversion coated surface which is formed provides good adhesion to an adjacent polymeric coating, for example, an epoxy bonded fiber glass resin of an adjacent insulating resist layer. The invention has been found to be particularly advantageous when the treated copper is a foil produced in a drum side treatment process which provides a copper foil where the smooth drum side is provided with an adhesion enhancing plating and the other side is rough, either or both sides being treated in accordance with the method of the invention. At a minimum, the drum side is treated with the adhesion promotion solution of the invention.

After contact of the copper surface with the adhesion promoter to form the micro-roughened conversion coated surface, generally a pre-preg layer may be placed directly adjacent to the copper surface and the pre-preg layer adhered directly to the copper surface in the adhesion step thereby forming a multi-layer printed circuit board. Generally, in the adhesion step, heat is applied to initiate the adhesion reaction. In the adhesion step, mechanical bonding is believed to be due to penetration of the polymer of the insulating layer into the micro-roughened surface provided in the adhesion promotion step. As an alternative to the pre-preg layer, the polymeric material may be applied directly on top of the micro-roughened surface produced in the adhesion promotion step in the form of a polymeric photoresist, screen-resist solder mask or adhesive material.

As mentioned above, the present invention avoids the use of multi-step pretreatment processes which require additional steps between a microetch step and the subsequent printed circuit board manufacturing step in which a polymeric layer is applied to the copper, including alkali dips, oxide and reducer steps. In addition, the present invention avoids the use of surfactants which may migrate to the surface of the coating interfering with the bond between the roughened surface and the polymeric coating and which may cause excessive foaming during use of the roughening composition.

In use, it is often desirable to follow the adhesion promotion step with a rinse step, though it is often adequate to rinse just with water. The treated surface is subsequently dried. In accordance with a preferred embodiment of the process, a polymeric material is subsequently adhered to the micro-roughened surface with a single rinse and drying step.

A pre-preg insulating layer may be applied directly to the micro-roughened surface and in the adhesion step, pressure is also applied by placing the layers which are to form the multilayer laminate of the printed circuit board or at least the innerlayer and outerlayer, in a press. Where pressure is applied, it is generally within a range of from 100 to 400 psi, preferably within the range of from 150 to 300 psi. The temperature will generally be 100° C., and more often, from 120° C. to 200° C. The adhesion step is generally carried out for a period of from 5 minutes to 3 hours, most usually from 20 minutes to 1 hour, but is for sufficient time and pressure and at a sufficiently high temperature to ensure good adhesion between layers. During the adhesion step, the partially cured polymeric material of the insulating layers which is generally an epoxy resin, tends to soften and wet the treated copper surface, prior to further reacting to become fully crosslinked, ensuring that the conductive pattern in the metal is substantially sealed between insulating layers and subsequent penetration of water and air is avoided. If desired, several layers may be placed together in the adhesion step to effect lamination of several layers in a single step to form the multi-layered board.

As will be seen, the present invention provides a considerably simplified process over the known processes and provides a surface formed from copper or other metals which has good adhesion.

Examples of the invention are given below. In the examples, results were measured in terms of the color of the coating as a correlation exists between color and coating thickness. Lighter colored coatings such as pink to light brown indicate thin coatings that are operative but not optimum. Reddish brown to dark brown coatings are of more desirable thickness and are more robust to subsequent handling. Black coatings are excessive and powdery.

EXAMPLES 1 TO 3

The following formulations were prepared:

| Example No. | 1 | 2 | 3 |
| --- | --- | --- | --- |
| Sulfuric acid (50%) | 170.0 ml | 170.0 ml | 170.0 ml |
| Hydrogen peroxide (35%) | 35.0 ml | 35.0 ml | 35.0 ml |
| Benzotriazole | 6.8 gm | 6.8 gm | 6.8 gm |
| Tetramethylammonium hydroxide (25%) | 100.0 mg | 500.0 mg | 2,500.0 mg |
| Water | to 1 liter | to 1 liter | to 1 liter |

An epoxy innerlayer material was cleaned and dried and then treated with one of the above formulations by immersion for two minutes at a temperature of 70° F. A lightly visible film formed on the copper.

EXAMPLES 4 TO 11

The composition of Example 1 was used replacing tetramethylammonium hydroxide with a 20 weight percent solution of tetrabutylammonium hydroxide in concentrations as set forth below:

| Example No. | Concentration (mg) |
| --- | --- |
| 4 | 0.0 |
| 5 | 2.5 |
| 6 | 5.0 |
| 7 | 25.0 |
| 8 | 100.0 |
| 9 | 250.0 |
| 10 | 500.0 |
| 11 | 1,000.0 |

Except for Example 4, in all cases, a light pink gray film formed.

EXAMPLES 12 TO 17

The composition of Example 1 was used replacing tetramethylammonium hydroxide with a 40 weight percent solution of methyltributylammonium hydroxide in concentrations as set forth below:

| Example No. | Concentration (mg) |
| --- | --- |
| 12 | 10.0 |
| 13 | 100.0 |
| 14 | 250.0 |
| 15 | 500.0 |
| 16 | 1,000.0 |
| 17 | 2,000.0 |

In all examples, a film formed which was pink at the lower concentrations of the quaternary ammonium hydroxide, but which became progressively darker as its concentration increased.

EXAMPLE 18

The procedure of Example was repeated, but the copper part was processed at 40° C. The coating formed was lighter in color but more uniform.

EXAMPLES 19 TO 23

The composition of Example 1 was used except that the tetramethylammonium hydroxide was replaced with a 40 weight percent solution of methyltripropylammonium hydroxide in concentrations as set forth below:

| Example No. | Concentration (mg) |
| --- | --- |
| 19 | 10.0 |
| 20 | 100.0 |
| 21 | 250.0 |
| 22 | 500.0 |
| 23 | 1,000.0 |

In all examples, a film formed which was pink at the lower concentrations of the ammonium hydroxide, but which became progressively darker as the concentration of the amine increased to a point where the coating was of a red brown coloration.

EXAMPLE 24

The procedure of example 23 was repeated, but the copper part was processed at 40° C. The coating formed was darker in color and more uniform.

EXAMPLES 24 TO 29

The composition of Example 1 was used replacing tetramethylammonium hydroxide with a 20 weight percent solution of methyltriethylammonium hydroxide in concentrations as set forth below:

| Example No. | Concentration (mg) |
|---|---|
| 24 | 10.0 |
| 25 | 100.0 |
| 26 | 250.0 |
| 27 | 500.0 |
| 28 | 1,000.0 |
| 29 | 2,000.0 |

In all examples, a film formed which was light pink at the lower concentrations of the ammonium hydroxide, but which became darker as the concentration increased to a point where the coating was a brown coloration.

EXAMPLES 30 TO 34

The composition of Example 1 was used replacing tetramethylammonium hydroxide with a 22.25 weight percent solution of methyltriethanolammonium hydroxide in concentrations as set forth below:

| Example No. | Concentration (mg) |
|---|---|
| 30 | 10.0 |
| 31 | 100.0 |
| 32 | 250.0 |
| 33 | 500.0 |
| 34 | 1,000.0 |

In all examples, a film formed which was light pink at the lower concentrations of the amine, but which became darker as the concentration of the amine increased.

EXAMPLES 35 TO 39

The composition of Example 31 was used with variation in the concentration of the sulfuric acid as set forth below:

| Example No. | Concentration (ml) |
|---|---|
| 35 | 50.0 |
| 36 | 75.0 |
| 37 | 100.0 |
| 38 | 150.0 |
| 39 | 200.0 |

In all examples, a film formed which was bronze at the lower concentrations of the amine, but which became darker as the concentration of acid increased to a point where the coating was a brown coloration.

EXAMPLES 40 TO 44

The procedure of the previous examples was repeated but the concentration of the amine was increased to 750 mg. In all examples, a film formed which was bronze at the lower concentrations of the amine, but which became darker as the concentration of acid increased to a point where the coating was of a brown coloration. Example 44 showed a darker color than all previous examples.

EXAMPLE 45

The following formulation was prepared:

| | |
|---|---|
| Sulfuric acid (50%) | 85.0 ml |
| Hydrogen peroxide (35%) | 35.0 ml |
| Benzotriazole | 6.8 gm |
| Methyltriethylammonium hydroxide (20%) | 2000.0 mg |
| Water | to 1 liter |

A light gray to brown film formed using the procedures of Example 1.

EXAMPLE 46

Example 45 was repeated with 20 ml of 85% phosphoric acid added to the as a dark brick red film. The phosphoric acid addition resulted in formation of a thicker, superior film and the addition of phosphoric acid constitutes a preferred embodiment of the invention.

EXAMPLES 47 TO 50

The following formaulation was prepared:

| | |
|---|---|
| Sulfuric acid (50%) | 85.0 ml |
| Hydrogen peroxide (35%) | 35.0 ml |
| Benzotriazole | 6.8 gm |
| Methyltripropyl ammonium hydroxide (40%) | 2000.0 mg |
| Water | to 1 liter |

Phosphoric acid was added in the following concentrations:

| Example No. | Concentration (ml) |
|---|---|
| 47 | 1.0 |
| 48 | 5.0 |
| 49 | 10.0 |
| 50 | 25.0 |

A dark brown film formed using the procedures of Example 1. Example 50 is one of the preferred embodiments of the invention.

EXAMPLES 51 TO 55

The composition of Example 29, modified to contain only 85 ml/l of 50% sulfuric acid, was used with varying concentrations of phosphoric acid as follows:

| Example No. | Concentration (ml) |
|---|---|
| 51 | 0.0 |
| 52 | 5.0 |
| 53 | 10.0 |
| 54 | 15.0 |
| 55 | 20.0 |

With the concentration of the composition of Example 51, each coating formed was dark brown and uniform.

EXAMPLES 55 TO 57

The following formulation was prepared:

| | |
|---|---|
| Total acid | 150.0 ml |
| Hydrogen peroxide (35%) | 35.0 ml |
| Benzotriazole | 6.8 gm |
| Tetramethyl ammonium hydroxide (25%) | 250.0 mg |
| Water | to 1 liter |

Mixtures of phosphoric and sulfuric acid were used in the examples. The concentration of the acids were as follows:

| | Concentration (ml) | |
|---|---|---|
| Example No. | Sulfuric | Phosphoric |
| 55 | 37.5 | 112.5 |
| 56 | 75.0 | 75.0 |
| 57 | 112.5 | 37.5 |

All coatings formed were of a strong red-brown coloration.

EXAMPLES 58 AND 59

The procedure of Examples 55 to 57 was repeated, with the concentration of 25% tetramethylammounium hydroxide reduced to 100 mg/l and the total acid concentration reduced by increase of the sulfuric acid concentration to 85 ml but reduction of the phosphoric acid concentration to 1 ml in example 58 and 5 ml in Example 59. In both coatings, the coloration was reduced to pink to light brown.

EXAMPLE 60

The procedure of Example 58 was repeated but the concentration of the tetramethylammonium hydroxide was increased to 1,000 mg and the concentration of the phosphoric acid was increased to 10 ml. The result was a darker brown coloration in the coating. Repetition of this example at 38° C. produced a browner and redder coating.

EXAMPLES 61 TO 72

The following formulation was prepared:

| | |
|---|---|
| Hydrogen peroxide (35%) | 35.0 ml |
| Benzotriazole | 6.8 gm |
| Tetramethyl ammonium hydroxide (25%) | 1,000.0 mg |
| Water | to 1 liter |

Mixtures of phosphoric and sulfuric acid in varying total acid concentrations were used in the examples. The concentration of the acids were as follows:

| | Concentration (ml) | |
|---|---|---|
| Example No. | Sulfuric | Phosphoric |
| 61 | 12.5 | 37.5 |
| 62 | 25.0 | 25.0 |
| 63 | 37.5 | 12.5 |
| 64 | 25.0 | 75.0 |
| 65 | 50.0 | 50.0 |
| 66 | 75.0 | 25.0 |
| 67 | 37.5 | 112.5 |
| 68 | 75.0 | 75.0 |
| 69 | 112.5 | 37.5 |
| 70 | 50.0 | 150.0 |
| 71 | 100.0 | 100.0 |
| 72 | 150.0 | 50.0 |

Coatings of maximum darkness and uniformity were obtained with a sulfuric to phosphoric acid ratio of 3 to 1 and a total acid content of 150 ml.

EXAMPLE 73–84

All examples 61 to 72 were repeated with reduction of the tetramethylammonium hydroxide content to 100 mg. In all cases, the coatings were generally similar to the corresponding examples 61–72 but slightly inferior in color and uniformity to the coatings obtain using the higher concentration of the tetramethylammonium hydroxide.

EXAMPLE 85–96

All of examples 61 to 72 were repeated with increase in the tetramethylammonium hydroxide content to 2,000 mg. In all cases, the coatings were generally similar to the corresponding examples 62–72 but inferior in color and uniformity to the coatings obtained using the lower concentration of the tetramethylammonium hydroxide indicating that there is an optimum upper limit to the concentration of the tetramethylammonium hydroxide.

EXAMPLES 97 TO 103

The following formulation was prepared:

| | |
|---|---|
| Sulfuric acid (50%) | 104.0 ml |
| Phosphoric acid (85%) | 21.0 ml |
| Hydrogen peroxide (35%) | 35.0 ml |
| Tetramethyl ammonium hydroxide (25%) | 500.0 mg |
| Water | to 1 liter |

Benzotriazole was added to the above composition in the following concentrations:

| Example No. | Concentration (g) |
|---|---|
| 97 | 0.0 |
| 98 | 1.0 |
| 99 | 2.0 |
| 100 | 3.0 |
| 101 | 4.0 |
| 102 | 5.0 |
| 103 | 6.0 |

The color of the film reduced from dark brown at the 6.0 gram level to light pink at the 2.0 level.

EXAMPLE 104

The color of the film reduced from dark brown at the 6.0 gram level to light pink at the 2.0 level.

EXAMPLE 104

The following example, which forms a brown red coating, represents the preferred embodiment of the invention.

| | |
|---|---|
| Sulfuric acid (50%) | 100.0 ml |
| Phosphoric acid (85%) | 25.0 ml |
| Hydrogen peroxide (35%) | 35.0 ml |
| Benzotriazole | 6.8 gm |
| Tetramethylammonium hydroxide (25%) | 500.0 mg |
| Water | to 1 liter |

EXAMPLES 105 TO 108

The following base formulation was prepared:

| | |
|---|---|
| Sulfuric acid (50%) | 100.0 ml |
| Phosphoric acid (85%) | 25.0 ml |
| Hydrogen peroxide (35%) | 35.0 ml |
| Benzotriazole | 6.8 gm |
| Water | to 1 liter |

2-Methylamino ethanol was added to the above base formulation in the following concentrations:

| Example No. | Concentration (mg) |
|---|---|
| 105 | 10.0 |
| 106 | 50.0 |
| 107 | 100.0 |
| 108 | 250.0 |

Brick red films were formed at all concentration levels indicating that substituted secondary amines are effective for purposes of the invention.

EXAMPLES 109 TO 112

Examples 105 to 108 were repeated substituting n-methyldiethanolamine for 2-methylamino ethanol at each concentration level with similar results obtained indicating that tertiary amines are suitable in the formulations of the invention.

EXAMPLES 113 TO 114

Examples 107 and 108 were repeated substituting methylamine for 2-methylamino ethanol with similar results obtained, indicating that primary amines are suitable in the formulations of the invention.

We claim:

1. A process for treating a metal surface comprising contacting the metal surface with an adhesion promotion composition comprising 0.1 to 20% by weight hydrogen peroxide, an inorganic acid, a corrosion inhibitor, and an amine selected from the group of primary amines, secondary amines, tertiary amines, quaternary ammonium compounds and mixtures thereof characterized by the amine being free of a substituent having surfactant properties to form a micro-roughened conversion coated surface.

2. The process of claim 1 where the amine is a quaternary ammonium hydroxide.

3. The process of claim 2 where the quaternary ammonium hydroxide is a tetraalkyl ammonium hydroxide.

4. The process of claim 1 where the quaternary ammonium hydroxide is present in an amount of from 0.01% to 2.5% by weight.

5. The process of claim 4 where the concentration varies between 0.1 and 1.0% by weight.

6. The process of claim 1 where the metal is copper or a copper alloy.

7. The process of claim 6 where the metal is copper traces on a printed wiring board.

8. The process of claim 1 where the hydrogen peroxide is present in the adhesion promotion composition in a concentration of from 0.5 to 10% by weight.

9. The process of claim 1 where the inorganic acid is a mixture of sulfuric and phosphoric acid.

10. The process of claim 9 where the concentration of the acid varies between about 1 and 30% by weight.

11. The process of claim 9 where the ratio of the sulfuric acid to the phosphoric acid varies between 3 and 1 to 1 and 3.

12. The process of claim 11 where the sulfuric acid is in excess of the phosphoric acid.

13. The process of claim 1 where the composition contains a corrosion inhibitor.

14. The process of claim 11 where the corrosion inhibitor is a member selected from the group consisting of a triazole, tetrazole and imidazole.

15. The process of claim 1 in which a polymeric material is subsequently adhered to the micro-roughened conversion coated surface.

16. The process of claim 15 for forming a multi-layer printed wiring board comprising an inner-layer and an outer-layer, the inner layer comprising at least one insulating layer and at least one conducting layer and the outer-layer comprising at least an insulating layer, in which the metal surface which is treated is a conducting layer.

17. The process of claim 15 in which, after the adhesion promotion step, a pre-preg layer is placed directly adjacent to the conducting layer and the two layers adhered to one another in the adhesion step, forming a multi-layer printed circuit board.

18. An adhesion promotion composition comprising 0.1 to 20% by weight hydrogen peroxide, an inorganic acid selected from the group consisting of sulfuric acid, phosphoric acid and mixtures thereof, a corrosion inhibitor, and an amine selected from the group of primary amines, secondary amines, tertiary amines, quaternary ammonium compounds and mixtures thereof characterized by the amine being free of a substituent having surfactant properties.

19. The composition of claim 18 where the inorganic acid is a mixture of sulfuric and phosphoric acid.

20. The composition of claim 19 where the concentration of the acid varies between about 1 and 30% by weight.

21. The composition of claim 19 where the ratio of the sulfuric acid to the phosphoric acid varies between 3 and 1 to 1 and 3.

22. The composition of claim 21 where the sulfuric acid is in excess of the phosphoric acid.

23. The composition of claim 18 where the amine is a quaternary ammonium hydroxide.

24. The composition of claim 23 where the quaternary ammonium hydroxide is a tetraalkyl ammonium hydroxide.

25. The composition of claim 18 where the quaternary ammonium hydroxide is present in an amount of from 0.01% to 2.5% by weight.

26. The composition of claim 25 where the concentration varies between 0.1 and 1.0% by weight.

27. The composition of claim 18 where the hydrogen peroxide is present in the adhesion promotion composition in a concentration of from 0.5 to 10% by weight.

28. The composition of claim 18 where the composition contains a corrosion inhibitor.

29. The process of claim 1 wherein the amine is a quaternary ammonium compound selected from tetramethylammonium hydroxide, tetrabutylammonium hydroxide, methyl tributylammonium hydroxide, methyl tripropylammonium hydroxide, and methyl triethylammonium hydroxide.

30. The composition of claim 18 wherein the amine is a quaternary ammonium compound selected from tetramethylammonium hydroxide, tetrabutylammonium hydroxide, methyl tributylammonium hydroxide, methyl tripropylammonium hydroxide, and methyl triethylammonium hydroxide.

* * * * *